(12) United States Patent
Kirsch et al.

(10) Patent No.: US 6,507,933 B1
(45) Date of Patent: Jan. 14, 2003

(54) AUTOMATIC DEFECT SOURCE CLASSIFICATION

(75) Inventors: Travis D. Kirsch, Austin, TX (US);
Bryon K. Hance, Austin, TX (US);
Carroll W. Webb, Dale, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/351,540

(22) Filed: Jul. 12, 1999

(51) Int. Cl.[7] .............................................. G06F 17/50
(52) U.S. Cl. .............................................. 716/4; 438/14
(58) Field of Search ............................ 716/2–4, 19–21; 438/12, 14–18, 10–11; 257/620, 913; 382/144, 149

(56) References Cited

U.S. PATENT DOCUMENTS

| | | | | |
|---|---|---|---|---|
| 5,240,866 A | * | 8/1993 | Friedman et al. | 438/17 |
| 5,539,752 A | * | 7/1996 | Berezin et al. | 702/35 |
| 5,859,698 A | * | 1/1999 | Chau et al. | 356/237.2 |
| 5,886,909 A | * | 3/1999 | Milor et al. | 700/110 |
| 5,913,105 A | * | 6/1999 | McIntyre et al. | 29/25.02 |
| 5,991,699 A | * | 11/1999 | Kulkarni et al. | 438/10 |
| 6,210,983 B1 | * | 4/2001 | Atchison et al. | 438/14 |
| 6,246,787 B1 | * | 6/2001 | Hennessey et al. | 250/559.45 |
| 6,292,582 B1 | * | 9/2001 | Lin et al. | 348/126 |
| 6,338,001 B1 | * | 1/2002 | Steffan et al. | 438/14 |

* cited by examiner

*Primary Examiner*—Matthew Smith
*Assistant Examiner*—Paul Dinh
(74) *Attorney, Agent, or Firm*—Hamilton & Terrile, LLP; Stephen A. Terrile

(57) ABSTRACT

A method and system for use in wafer fabrication quality control. The method and system make quantitative a qualitative integrated circuit wafer defect signature. In response to the quantitativize wafer fabrication defect signature, the method and system identify at least one cause of the defect signature.

46 Claims, 11 Drawing Sheets

AUTOMATIC DEFECT SOURCE CLASSIFICATION

BACKGROUND OF THE INVENTION

1. Field of the Invention

This invention relates to quality control in the field of integrated circuit wafer manufacturing and testing.

2. Description of the Related Art

Integrated circuit manufacturing and testing requires a high degree of quality control. An integrated circuit (IC) is a miniature electric circuit composed of hundreds to tens of millions of discrete electronic circuit elements (e.g., transistors, resistors, capacitors, or inductors). Multiple ICs are manufactured, or formed, on semiconductor wafers (also known as integrated circuit wafers), through a series of oxidations, implants, controlled deposition of materials, and selective removal of materials. Manufacturing integrated circuit wafers typically requires upwards of between two hundred and four hundred discrete manufacturing steps.

Once the manufacturing process is complete, a wafer will be divided into individual die (or chips). Each functional die will be sold as an individual IC. The quality of the manufacturing process is measured by percent yield (percent of functioning die divided by total possible die per wafer). One of the main causes of reduced yield is particle defects introduced during the manufacturing process.

In order to maintain high yields, semiconductor manufactures use two approaches to monitor defect levels (number of defects at a manufacturing step) in the manufacturing process. The first approach is to inspect product wafers at multiple steps in the manufacturing process. The second approach is to use short loop monitors on key pieces of process equipment. Short loop monitors are test wafers that are processed through a few process steps. There are multiple types of short loop monitors that are used in different areas of the manufacturing process, and on different process equipment. The advantage of short loop monitors are their simplicity, high sensitivity to defects, and low jeopardy for use on suspect process equipment. The disadvantage is that they are expensive. The advantages of product wafer inspection are no added test wafer cost, and sensitivity to integration defects. The disadvantage is reduced sensitivity to defects caused by process variation inherent in semiconductor manufacturing, and the inability to determine the source of the defects.

In order to ensure that the integrated circuit wafers are correctly formed, tight quality control is needed. One form of quality control is to ensure that one or more production tools (a production tool is a term of art meaning a piece of equipment utilized as a tool to produce a semiconductor wafer) are functioning within tolerances. One way in which this is done in the art is that defect levels of both short loop monitors and product inspectionings are monitored by statistical process control (SPC). In the event of SPC failure, the product or short loop must be dispositioned.

In SPC, a wafer inspection tool inspects an integrated circuit wafer and creates a defect table listing noted defects on the inspected integrated circuit wafer. Thereafter, defects from the integrated circuit wafer's defect table (a descriptive listing of defects on the integrated circuit wafer) are compared to an SPC metric. If the comparison finds the integrated circuit wafer within tolerances, no action is taken. However, if the comparison with the SPC metric fails, the product or short loop must be dispositioned. The product or short loop is dispositioned via a process known in the art as "dispositioning."

Dispositioning, as that term is used within the art, generally entails a human (a "dispositioner") doing the following: (1) examining a pictographic representation of defects (a "defect map") in a completely or partially formed integrated circuit wafer; (2) determining whether a pattern of defects on a defect map represents significant defects in the manufacture of the completely or partially formed integrated circuit wafer; (3) if a determination is made that the wafer does not contain significant defects, allowing the production equipment to run unimpeded; and (4) if a determination is made that the defect map of the wafer represents significant defects in the manufacture of the wafer, determining one or more likely "causes" of the significant defects, where the determination of the "cause" encompasses both (a) where the defect occurred (e.g., the most likely production tool at which the defects occurred) and (b) why the defect occurred (e.g., bad materials used at/by a production tool, a process tool needs to be cleaned, or a mechanical failure in the process tool is producing defects).

Dispositioning is a very important aspect of integrated circuit wafer manufacturer quality control. Dispositioners have the ability to slow down or stop the production process. Dispositioners also have the ability to allow the production process to run unimpeded. It is therefore important that dispositioning be done with as much precision and accuracy as is possible since dispositioners essentially control a significant aspect of the production process.

There are several problems associated with dispositioning, as dispositioning is performed in the art. A few of those problems are as follows. First, it takes roughly 6 months to 2 years to adequately train a human to do dispositioning. This training typically involves teaching the prospective dispositioner to recognize certain visual patterns (known in the art as "defect signatures") in defect maps, and associate those certain patterns with specific "causes" of the defects within the production process of the integrated circuit wafers. Second, being human, dispositioners are tremendously variable, with some being markedly better than others. Third, what the dispositioners are taught is not quantitative but qualitative—the dispositioners are taught to associate "causes" with visual patterns in the defect maps—and thus there is the associated human variability in visual perception and interpretation. Fourth, dispositioners, being human, are prone to human error, illness, lack of attention, etc. Fifth, when a change is made in a production process, human dispositioners often have difficulty in responding to the change.

It is therefore apparent that a need exists in the art for a method and system which will automatically perform the functions currently performed by the human dispositioners, such that the training, errors, and variability associated with the human dispositioners can be substantially avoided.

SUMMARY OF THE INVENTION

A method and system have been invented which will automatically perform the functions currently performed by the human dispositioners, such that the training, errors, and variability associated with the human dispositioners can be substantially avoided. The method and system quantitativize[1] a qualitative integrated circuit wafer defect signature. In response to the quantitativized wafer fabrication defect signature, the method and system identify at least one cause of the defect signature.

[1] As used herein, the term "quantitativize" (quantitative+ize suffix) is used to describe the operation of making quantitative something that is qualitative. Furthermore, as used in this application, the terms quantitative+ed suffix, quantitative+ization suffix, and quantitative+izing suffix are used to indicate qualitative things that have been made quantitative, the operation of making something qualitative quantitative, and the action of making something qualitative quantitative, respectively.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
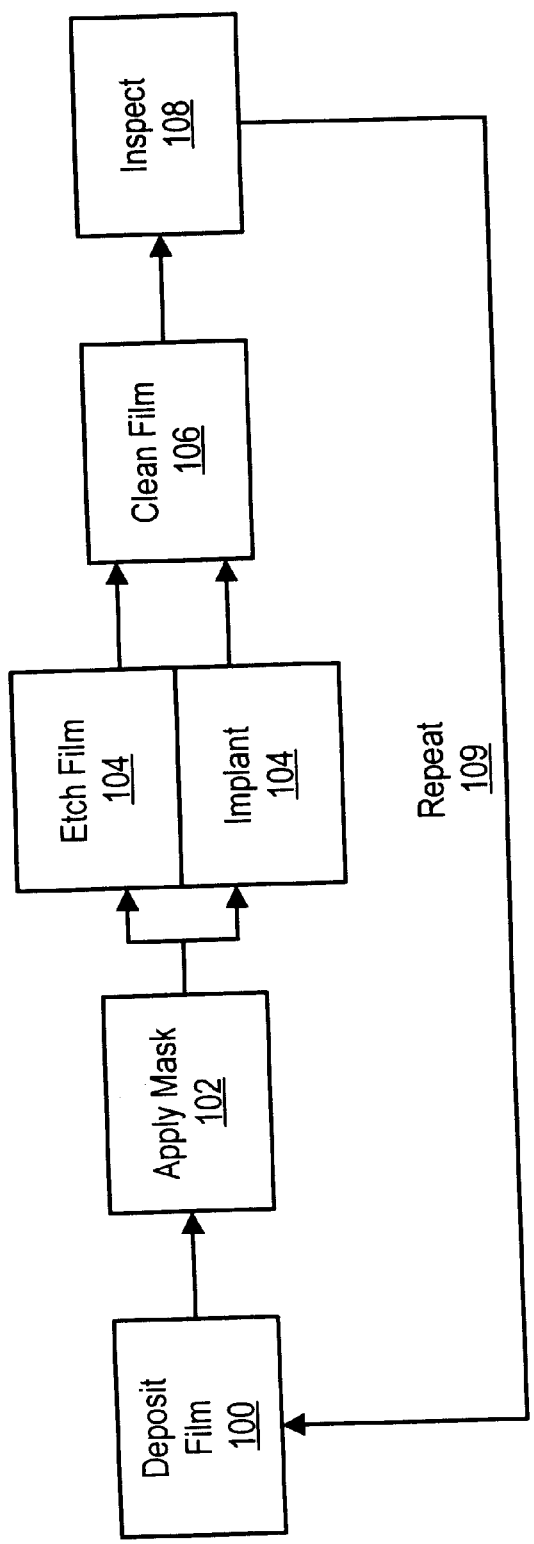
FIG. 1 shows a high-level flow diagram depicting a related-art process by which integrated circuit wafers are manufactured.

With reference to the figures, and in particular with reference now to FIG. 1, shown is a high-level flow diagram depicting a related-art process module by which integrated circuit wafers are manufactured. Depicted is that the first operation in production is for film to be deposited (or grown) 100 on a wafer. Thereafter, shown is that a mask is applied 102 to the wafer. Next, illustrated is that the wafer is etched to selectively remove material or implanted (with ions which will give the semiconductor wafer material the desired electrical characteristics) 104, at this point, the organic polymers of the photomask and/or polymer byproducts of the etch process must be removed from the wafer. Thereafter, remaining film is cleaned away 106. Finally, the wafer is inspected for defects 108. Thereafter, repetitive step 109 shows that the basic process module is repeated. Typically, many repetitions of the basic process module (or the basic process module with major or minor variations) are necessary to produce a completed integrated circuit wafer.

Those skilled in the art will recognize that each of the process flow operations depicted in FIG. 1 may be composed of many sub-operations. For example, the operation of applying the mask 102 can itself entail many sub-operations.

Figure 2:
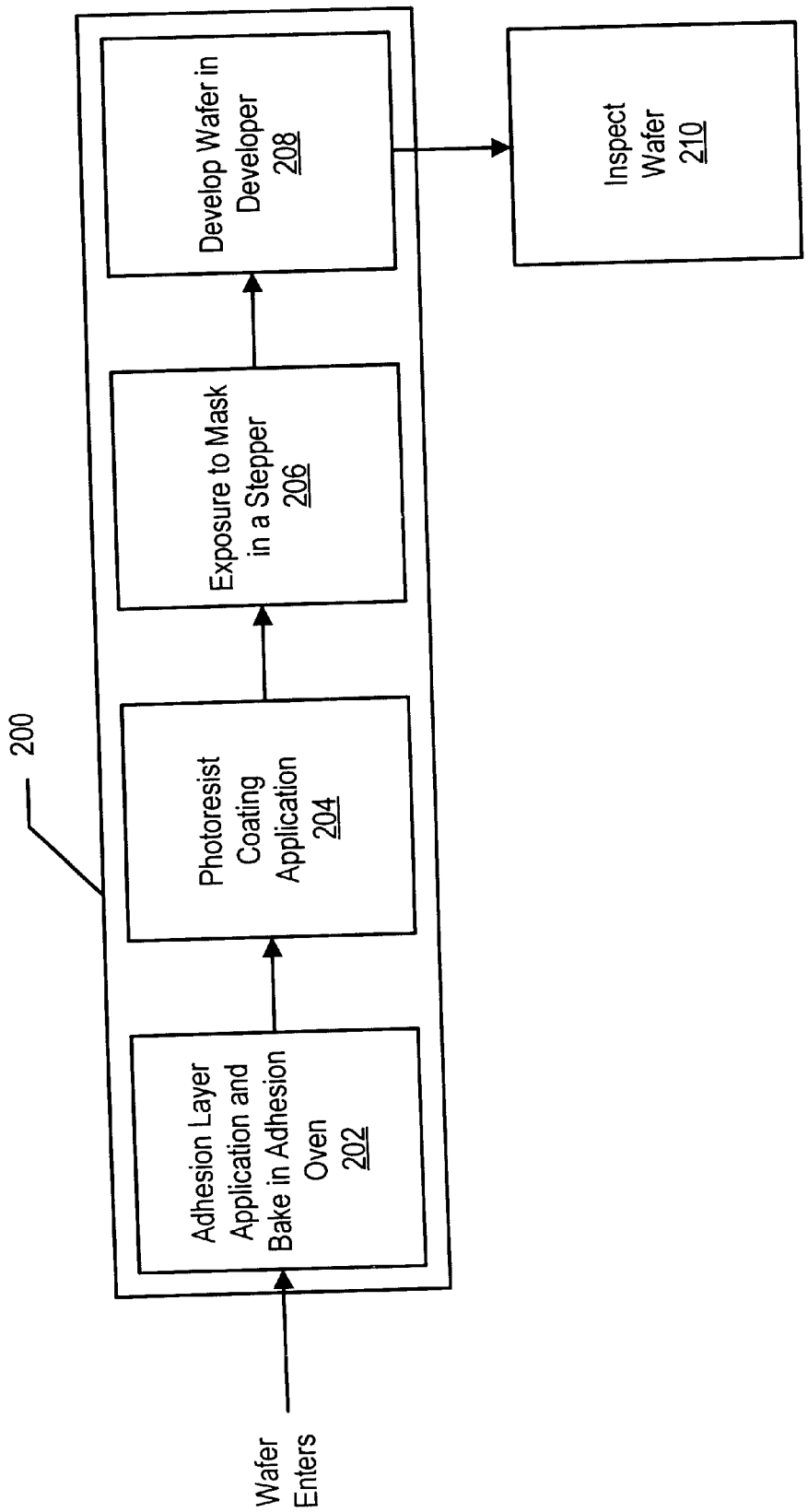
FIG. 2 shows a high-level process flow diagram depicting a related-art process by which a mask is applied to a wafer, an operation sometimes referred to as photolithography.

Referring now to FIG. 2, shown is a high-level process flow diagram depicting a related-art process by which a mask is applied to a wafer, an operation sometimes referred to as photolithography. Depicted is that a wafer (not shown) enters photocell 200 (a production tool which does photolithography) and undergoes the operation of adhesion layer application 202, wherein the wafer is coated with an adhesion material and baked in an adhesion oven. Thereafter, illustrated is that the wafer undergoes the operation of photoresist coating application 204, (the photoresist coating is a photo-active coating that develops different characteristics in response to exposure to high energy light). Subsequent to the application of the photoresist coating, depicted is that the wafer undergoes exposure to high energy (e.g., laser or mercury vapor) light 206, where the light is patterned using a "mask" which causes the high energy light to fall in a predetermined pattern on the resist material such that desired integrated circuit patterns are created on the material. Those skilled in the art will appreciate that one or more groups of integrated circuit die on an integrated circuit wafer are generally exposed in a group-wise fashion via the use of a "stepper" which "steps" across the surface of a wafer in an ordered fashion, exposing the photoresist of a group of integrated circuit die to the patterned light at each "step" of the stepper (e.g., for a wafer used to form three hundred integrated circuit chips, a stepper might expose a group of, say four chips, in 75 moves, or steps). Subsequent to exposure to high energy light, the exposed wafer is developed 208, via the use of developing chemicals, such that the exposed pattern of step 206 is dissolved and washed away leaving the unexposed pattern. Thereafter, the wafer is subsequently inspected 210 (inspection includes the dispositioning operation).

Figure 3:
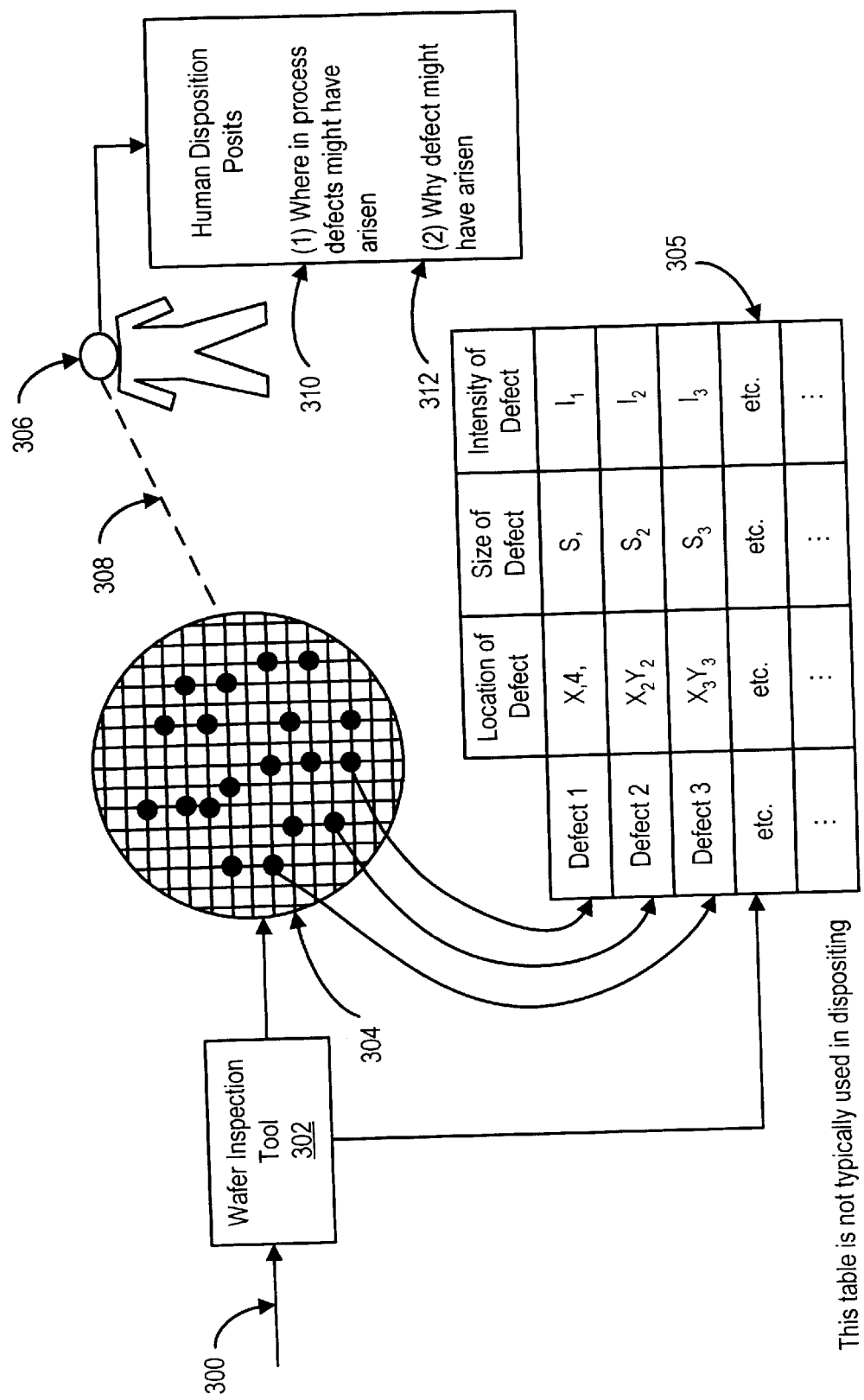
FIG. 3 depicts a related art dispositioner engaging in the dispositioning operation related to the series of operations and devices described in relation to FIG. 2.
Figure 4A:
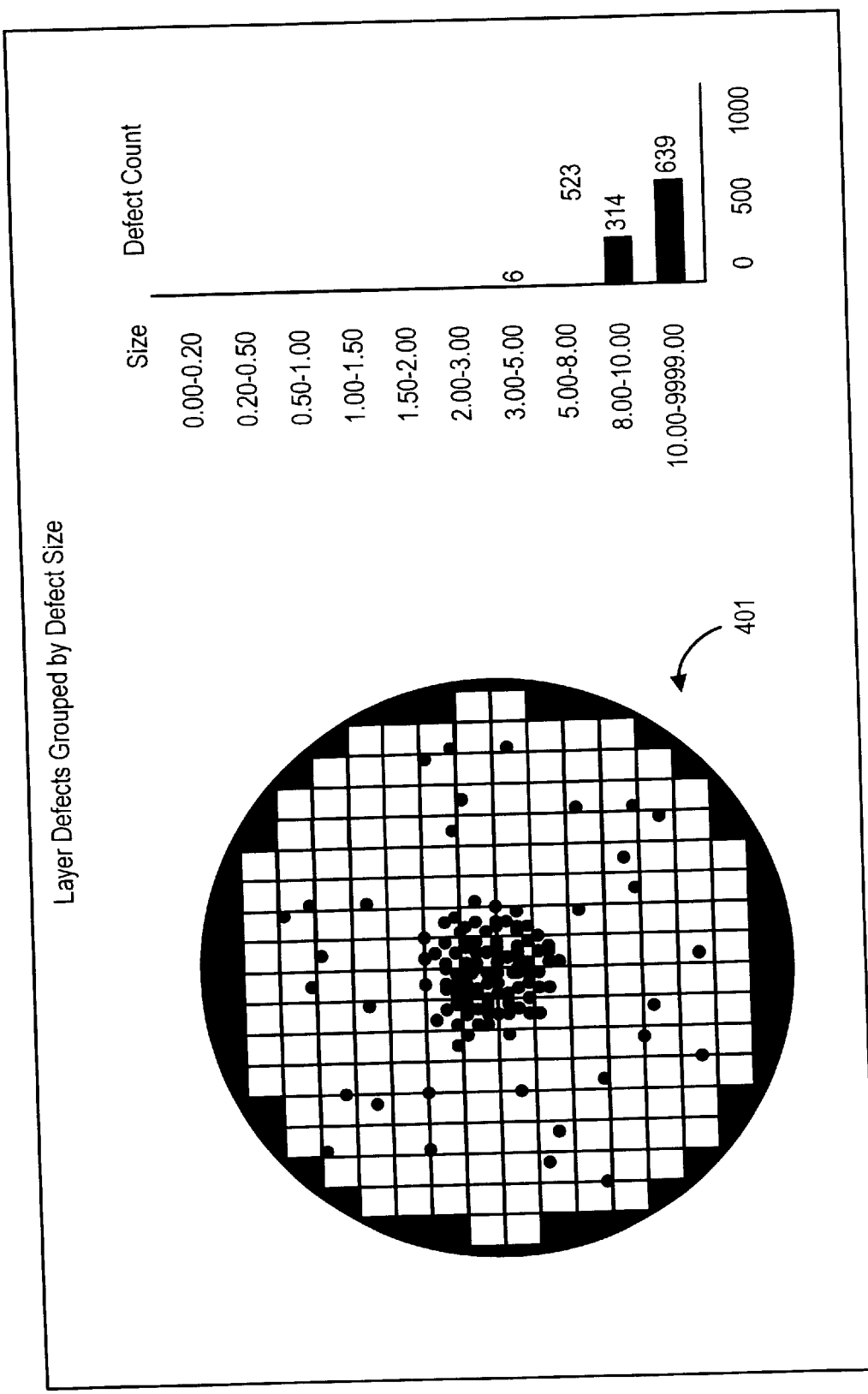
FIGS. 4A, 4B, 4C and 4D (generally referred to as FIG. 4) show example defect maps associated with equipment failures and dirty equipment hypothetically related to the series of operations and devices described in relation to FIG. 2, as well as what a skilled human dispositioner would learn from the defect maps shown.
Figure 4B:
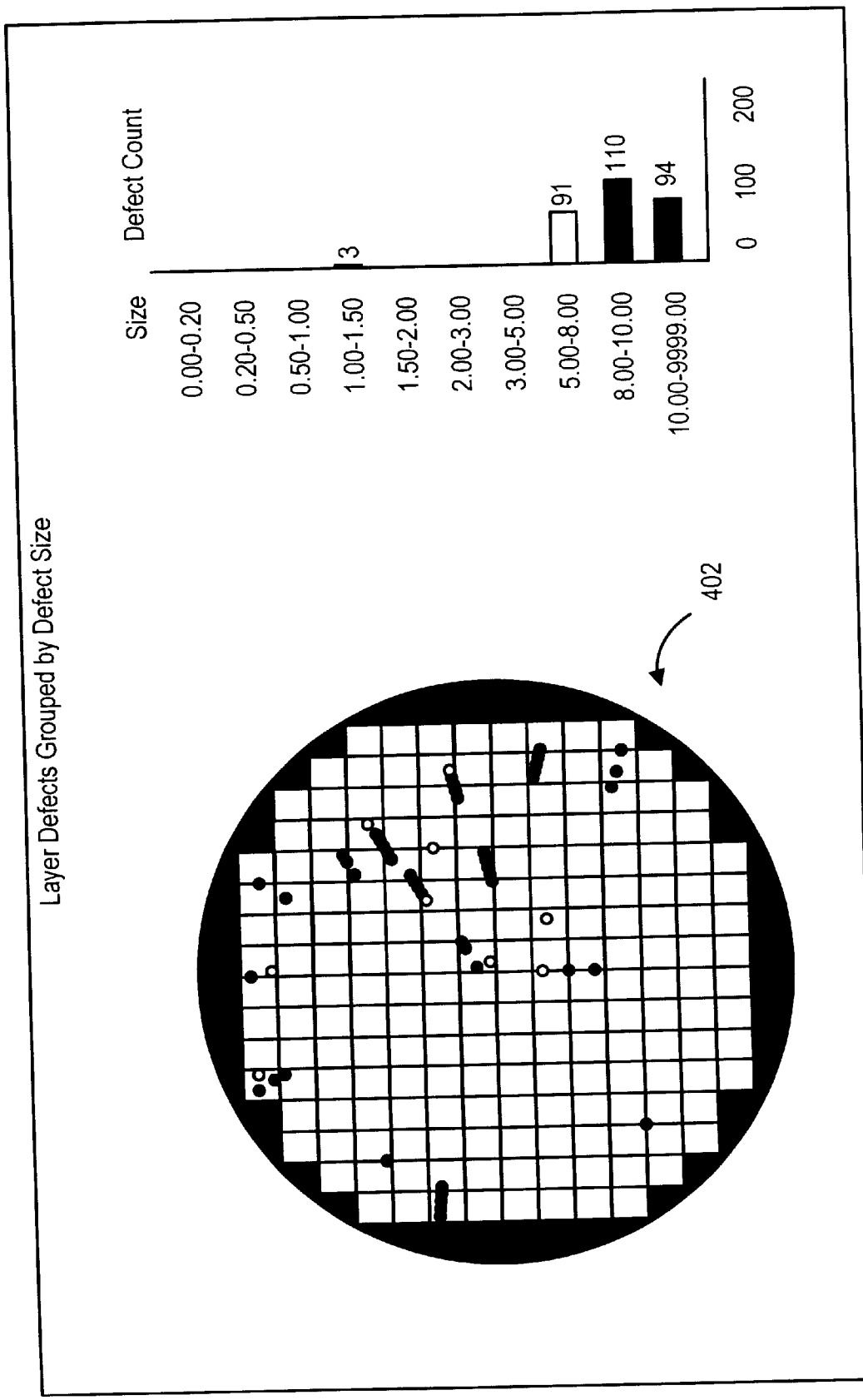
Figure 4C:
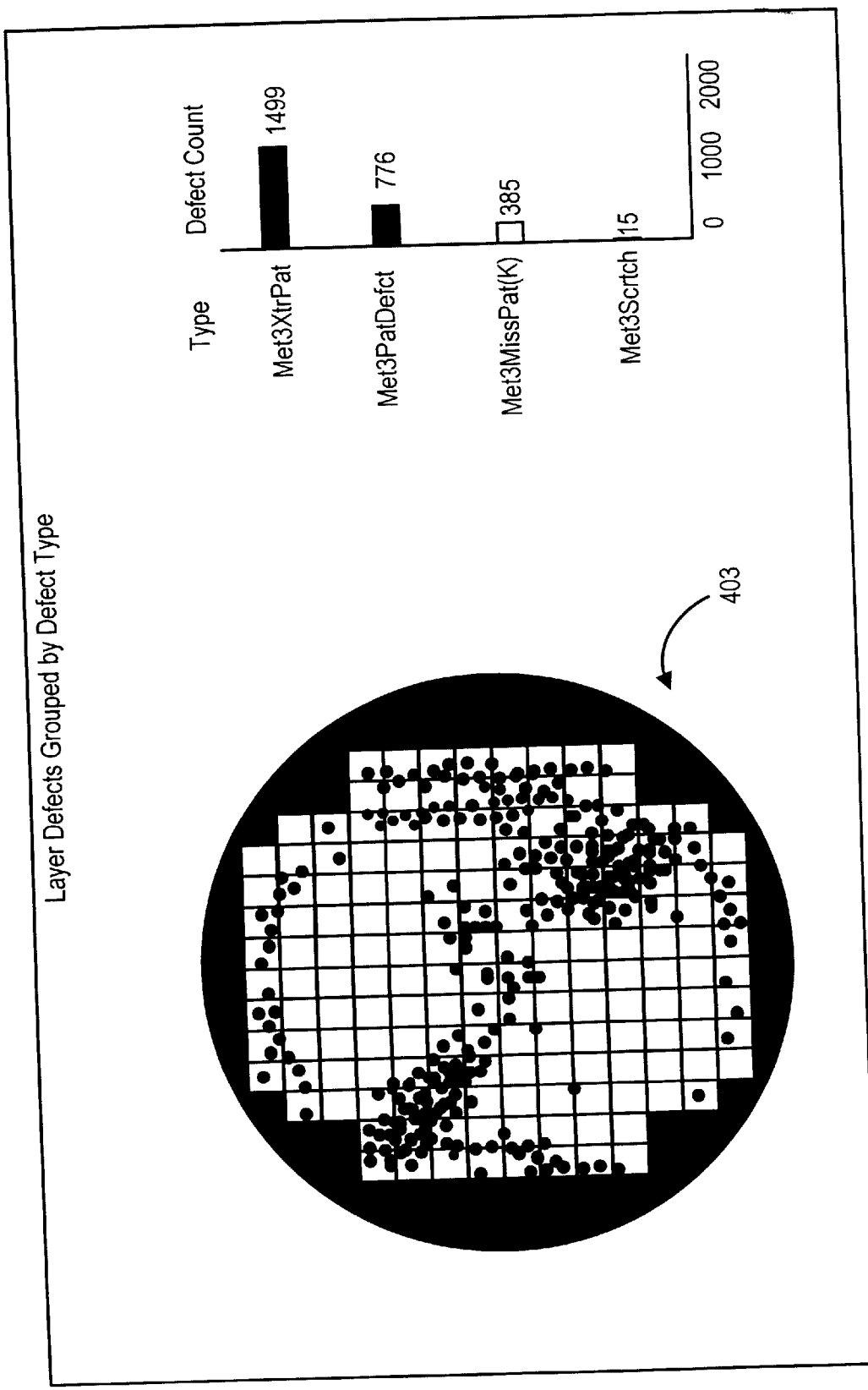
Figure 4D:
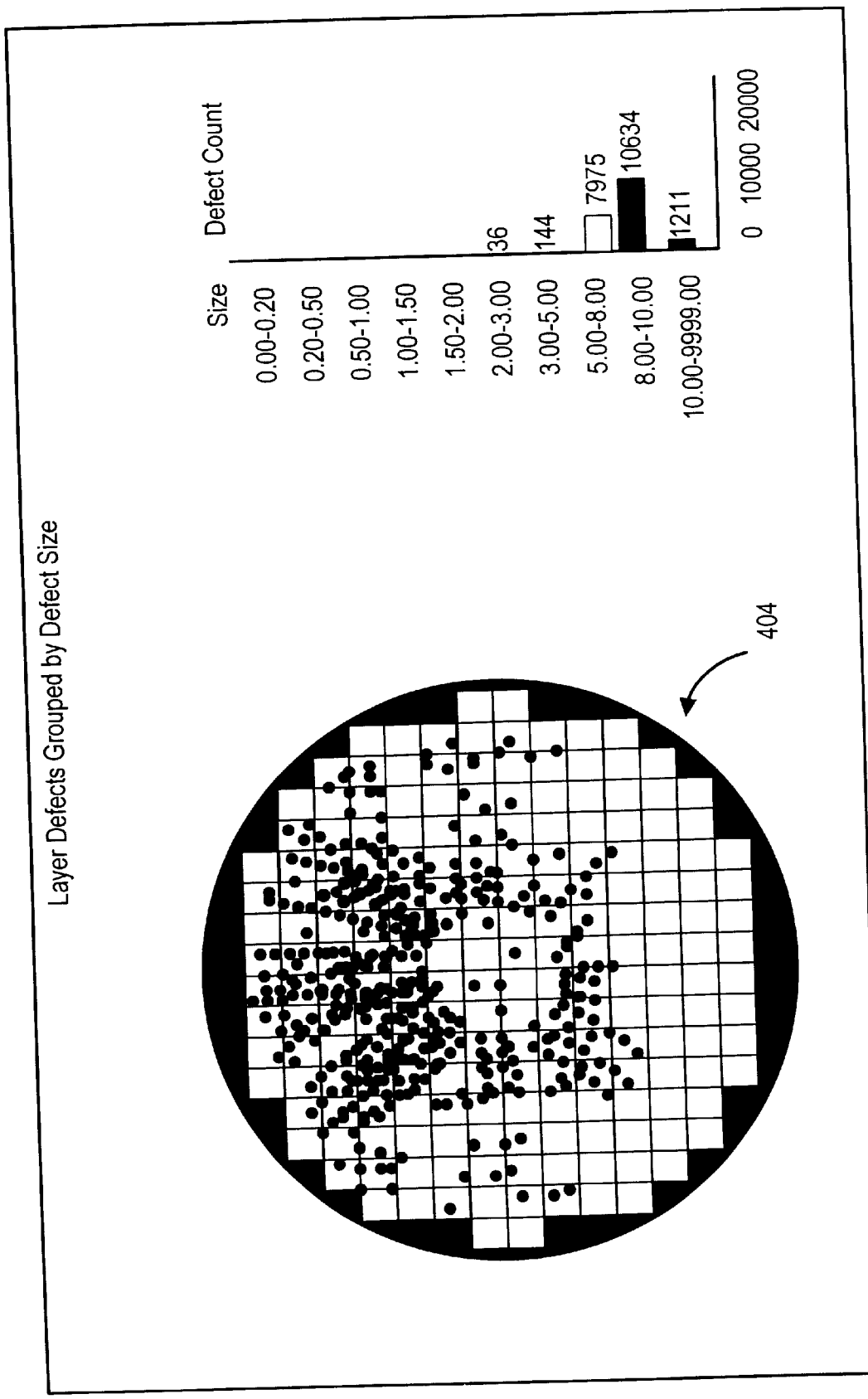

Referring now to FIG. 3, depicted is a related art dispositioner engaging in the dispositioning operation related to the series of operations and process tools described in relation to FIG. 2. Illustrated is that a wafer (not shown) enters 300 wafer inspection tool 302. Wafer inspection tool 302 produces defect location, defect size, and defect intensity table 305 (e.g., shown in FIG. 3 is that defect 1 has a position of $x_1$, $y_1$, a defect size of $S_1$, and defect intensity of $I_1$; defect 2 has a position of $x_2$, $y_2$, a defect size of $S_2$, and defect intensity of $I_2$; and defect 3 has a position of $x_3$, $y_3$; a defect size of $S_3$; and defect intensity of $I_3$), and its associated defect map 304.

Subsequent to defect inspection by wafer inspection tool 302 Statistical Process Control (SPC) determines if the number of defects detected is acceptable. If the number of defects on the wafer (not shown) inspected by wafer inspection tool 302 is below a predefined statistical limit, no further action is taken and normal processing of the wafer continues. If the number of defects on the wafer (not shown) inspected by wafer inspection tool 302 is greater than or equal to the predefined statistical limit, the lot (a grouping of 1 to 25 wafers to facilitate making semiconductor wafers move through the production area) is placed on hold and requires dispositioning.

Once a lot is placed on hold, a sampling of the defects (typically 50 defects per wafer) must be reviewed and classified. The classifications are derived by each manufacturing facility to describe the defect type and nature, and vary from facility to facility. As will be described below, defect classification can be done manually by human dispositioner 306 or, automatically using Automatic Defect Classification (ADC). The dispositioner must then take the wafer map and defect types and then determine the source of the defects, and the corrective action. In most cases, the pattern of defects on the wafer map and the types of defects on the wafer are unique for a specific problem of a specific process tool. This combination of defect map pattern and defect types is known in the industry as a process signature.

Subsequent to the production of defect map 304, human dispositioner 306 visually inspects 308 defect map 304 and determines whether a significant defect pattern is indicated by defect map 304 (as noted in FIG. 3, human dispositioner 306 typically does not use associated defect location, defect size, and defect intensity table 305, in that this table is generally produced for an operation other than dispositioning). In the event that a significant defect pattern is indicated by defect map 304, human dispositioner 306 then in response the morphology (overall shape, or defect signature) of defect pattern 304 (a) posits 310 one or more points in the process of producing the wafer where the significant defect pattern might have arisen, and (b) for each posited one or more points in the process wherein the defect pattern might have arisen, posits 312 one or more events or conditions which might have caused the defect patterns to arise.

Referring now to FIG. 4, shown are some defect maps associated with problems that occur in the series of operations and processing tools described in relation to FIG. 2, as well as what a skilled human dispositioner would learn from them. Defect map 401 shows a defect signature consisting of a cluster of defects in the center, with some dispersion of defects in the periphery. From defect map 401, human dispositioner 306 would, as a first guess, determine that the most likely place where the cause of the defect signature resides would be in relation the operation of adhesion layer application 202, and that the most likely reason why the defect has arisen is that the gas in the adhesion delivery lines (the adhesion layer should be delivered in gaseous form) has become liquefied. Defect map 402 shows multiple linear clusters of defects that are oriented toward the center of the wafer; the defects in defect map 402 are predominately large defects of distorted pattern defect type. From defect map 402, human dispositioner 306 would, as a first guess, determine that the most likely place where the cause of the defect signature resides would be in relation to the operation of a photoresist coating application 204, and that the most likely reason why the defect has arisen is that there was inadequate delivery of resist coating to the wafer. Defect map 403 shows a defect signature consisting of a tight distribution of defects on the diagonal with additional defects swirled in the counter-clockwise direction at the ends of the diagonal; the defects in defect map 403 range from small to large defects. From defect map 403, human dispositioner 306 would, as a first guess, determine that the most likely place where the cause of the defect resides in relation to the operation wherein exposed wafer is developed 208, and that the most likely reason why the defect has arisen is that there was contamination on the nozzle which dispensed the developing chemicals. Defect map 404 shows a defect signature with an abnormally high concentration of radially oriented defect clusters and relatively low defect density in the center, and left and right quadrants of the wafer; the predominant defect type is small particle. From defect map 404, human dispositioner 306 would, as a first guess, determine that the most likely place where the cause of the defect resides in relation the operation of adhesion layer application 202, and that the most likely reason why the defect has arisen is that there was inadequate delivery of gas from adhesion delivery lines.

Figure 5:
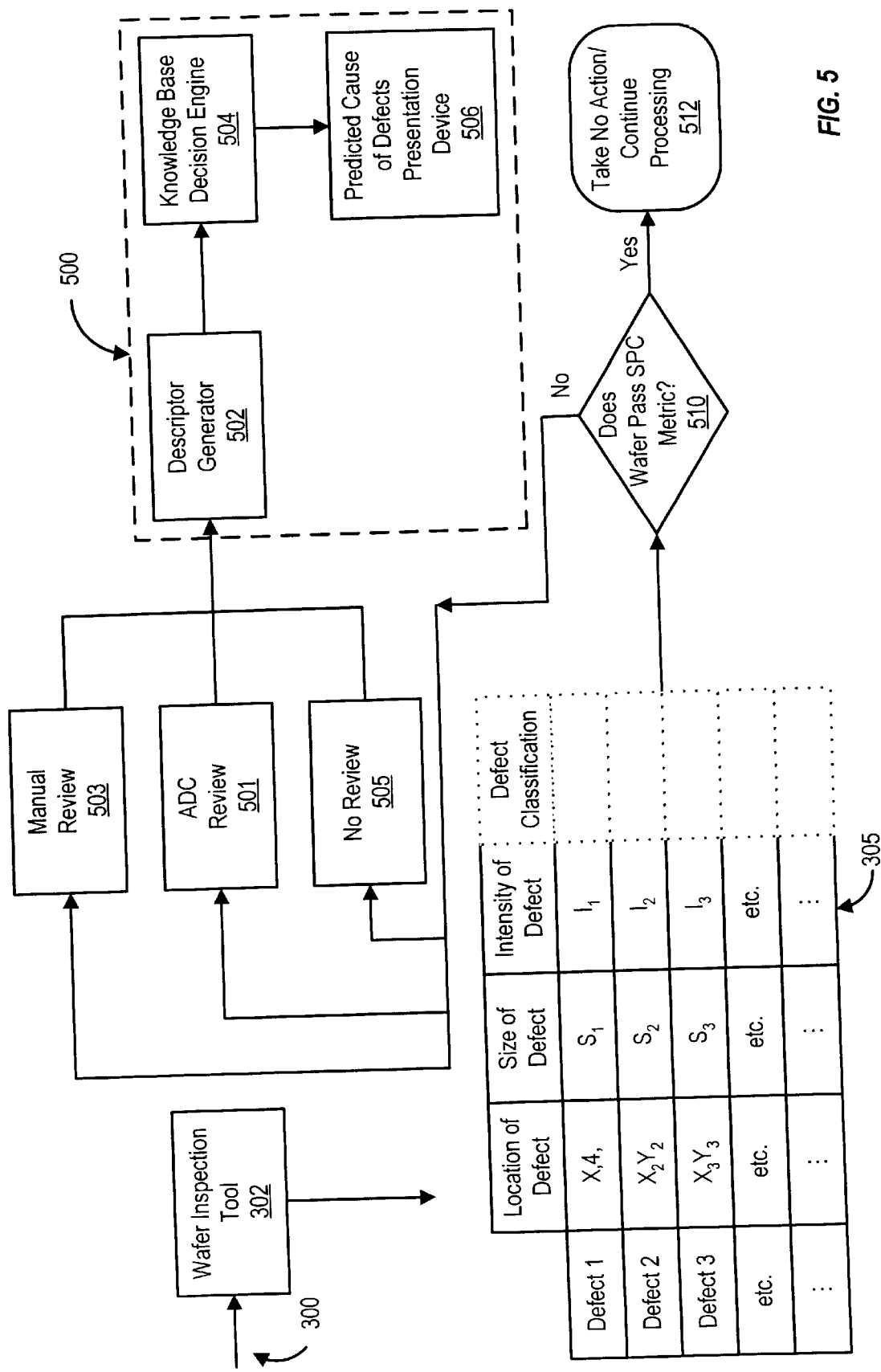
FIG. 5 depicts the human dispositioner of FIG. 3 replaced by an automated dispositioning device.

Referring now to FIG. 5, depicted is the human dispositioner of FIG. 3 replaced by automated dispositioning device 500. Illustrated is that a wafer (not shown) enters 300 wafer inspection tool 302. Wafer inspection tool 302 produces associated defect location, defect size, and defect intensity table 305. Subsequent to the production of defect intensity table 305, illustrated is that all or part of the information in defect intensity table 305 is compared 510 with a Statistical Process Control (SPC) metric. If the number of defects on the wafer (not shown) inspected by wafer inspection too 302 is below the SPC metric (i.e., below a statistical limit), shown is that normal processing of the wafer continues and that no further action is taken 512. If the number of defects on the wafer (not shown) inspected by wafer inspection tool 302 is greater than or equal to the SPC metric (i.e., at or above a statistical limit), the lot (a grouping of 1 to 25 wafer to facilitate making semiconductor wafers move through the production area) is placed on hold and since it is known that the lot requires dispositioning.

In the event that dispositioning is required, illustrated is that automatic defect classification (ADC) unit 501 accepts associated defects location, defect size, and defect intensity table 305 and classifies[2] (,with such classification illustrated by the optional "defect classification" column of table 305) selected defects in the defect pattern indicated by defect map 304. Alternatively, shown is that associated defect location, defect size, and defect intensity table 305 is manually inspected 503 and selected defects therein classified[3] (with such classification illustrated by the optional "defect classification" column of table 305). Yet again alternatively, depicted is that associated defect location, defect size, and defect intensity table 305 is passed with no review 505 to descriptor generator 502 without defect classification. Each of these alternate paths (i.e., through an ADC system, manual inspection, or no inspection), in conjunction with the rest of the system shown constitute stand-alone versions of the overall system shown.

[2] Those skilled in the art will recognize that defect classifications are routinely generated in the art by an ADC system. Those skilled in the art will also recognize that not all wafers are classified, and that very seldom are all defects on a given wafer classified. However, those skilled in the art will recognize that when a wafer has an abnormally high number of defects, which is determined by different statistical tests, some of the defects will be classified. It is to be understood that the processes and devices discussed herein are not dependent upon on defect classifications, but that the processes and devices are disclosed which can make use of such classifications when they exist. One example of a well-known ADC system is the Leica ADC NT system, manufactured by Leica Company of Allendale, N.J.

[3] Those skilled in the art will recognize that such data can be entered by a human user based on the human user's perception, but that such human produced data would be sub-optimum. Those skilled in the art will recognize that defect classifications are routinely generated in the art by a human user based on the human user's perception, but that such human produced data is typically sub-optimum. It is to be understood that the processes and devices discussed herein are not dependent upon on defect classifications, but that the processes and devices are disclosed which can make use of such classifications when they exist.

Subsequent to the alternative operations associated with either ADC unit 501, manual inspection 503, or passing associated defect location, defect size, and defect intensity table 305 with no review 505, illustrated is that descriptor generator 502 accepts the quantitativized[4] the defect pattern; descriptor generator 502 uses associated defect location, defect size, and defect intensity table 305 to produce a quantitativized representation of the defect pattern, or defect signature, which in the related art by human dispositioner 306. Descriptor generator 502 uses associated defect location, defect size, defect intensity, and defect classification (classification is optional, as discussed above) table 305 to produce a quantitativized representation of the defect pattern, or defect signature, by first performing a grouping calculation of the quantitativized defect pattern and then utilizing the grouping calculation to calculate mathematical descriptors of the defect pattern (via a process described below).[4] Thereafter, knowledge based decision engine 504 accepts the quantitativized defect map (i.e., the calculated mathematical descriptors), and, in response the quantitativized defect pattern (a) posits one or more points in the process of producing the wafer where the significant defect pattern might have arisen, and (b) for each posited one or more points in the process wherein the defect pattern might have arisen, posits one or more events or conditions which might have caused the defect patterns to arise. Thereafter, predicted cause of defects presentation device 506 (which could be, for example, a computer display unit) presents the posited one or more points in the process of producing the wafer where the significant defect pattern might have arisen, and the posited one or more events or conditions which might have caused the defect patterns to arise.

[4] As used herein, the term "quantitativize" (quantitative+ize suffix) is used to describe the operation of making quantitative something that is qualitative. Furthermore, as used in this application, the terms quantitative+ed suffix, quantitative+ization suffix, and quantitative+izing suffix are used to indicate qualitative things that have been made quantitative, the operation of making something qualitative quantitative, and the action of making something qualitative quantitative, respectively.

Figure 6:
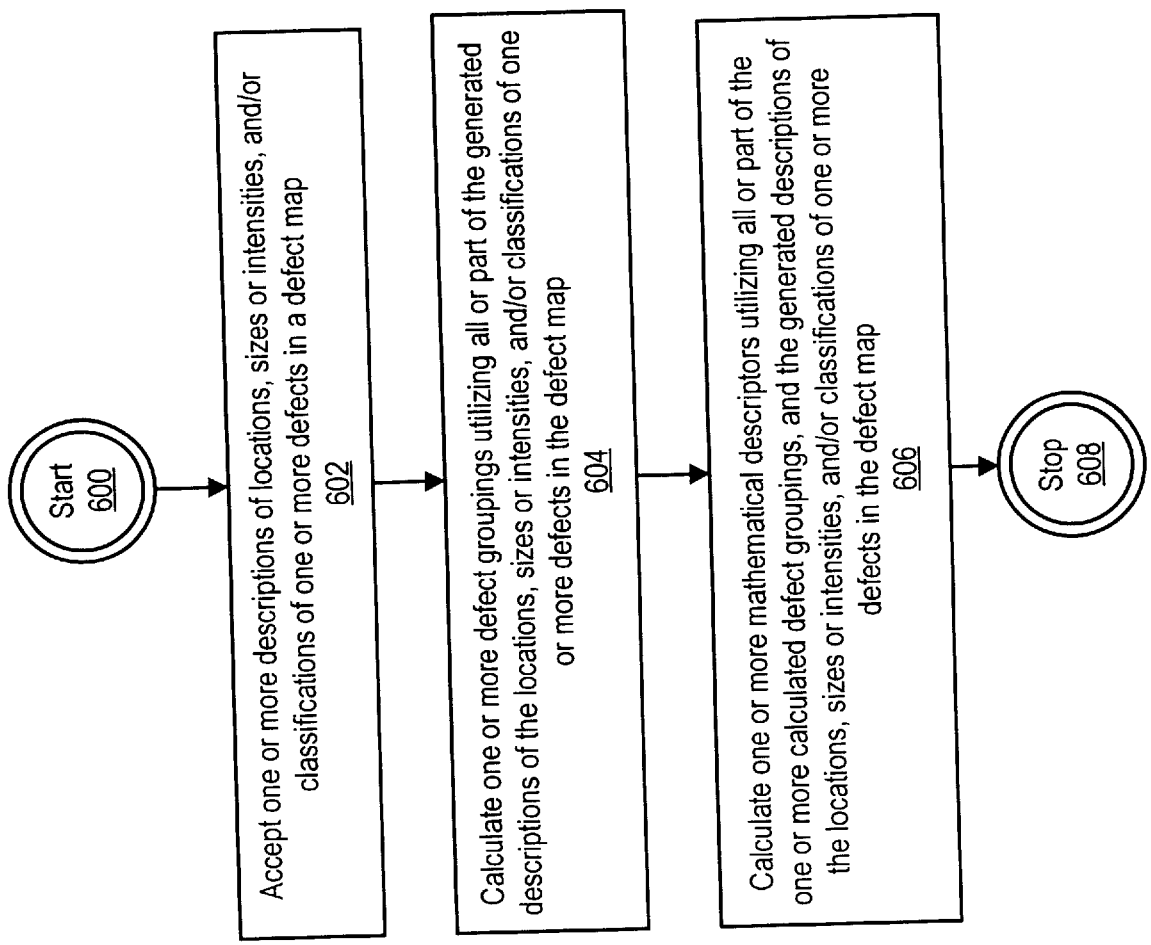
FIG. 6 shows a high-level logic flowchart of an example of the quantitativization process utilized by descriptor generator 502 to effect the quantitativization of a defect pattern indicated by a defect map.

Referring now to FIG. 6, shown is a high-level logic flowchart showing an example of the quantitativization process utilized by descriptor generator 502 to quantitativize a defect pattern indicated by a defect map. Method step 600 shows the start of the process. Method step 602 shows that acceptance of one or more descriptions of locations, sizes, intensities, and/or classifications of one or more defects in associated defect location, defect size, and defect intensity table 305. Method step 604 shows the calculation of one or more defect groupings utilizing all or part of the locations, sizes, intensities, and/or classifications of the one or more defects referenced in method step 602. Thereafter, method step 606 shows the calculation of one or more mathematical descriptors utilizing all or part of the one or more defect grouping calculations of method step 604. Method step 608 shows the end of the process.

Figure 7:
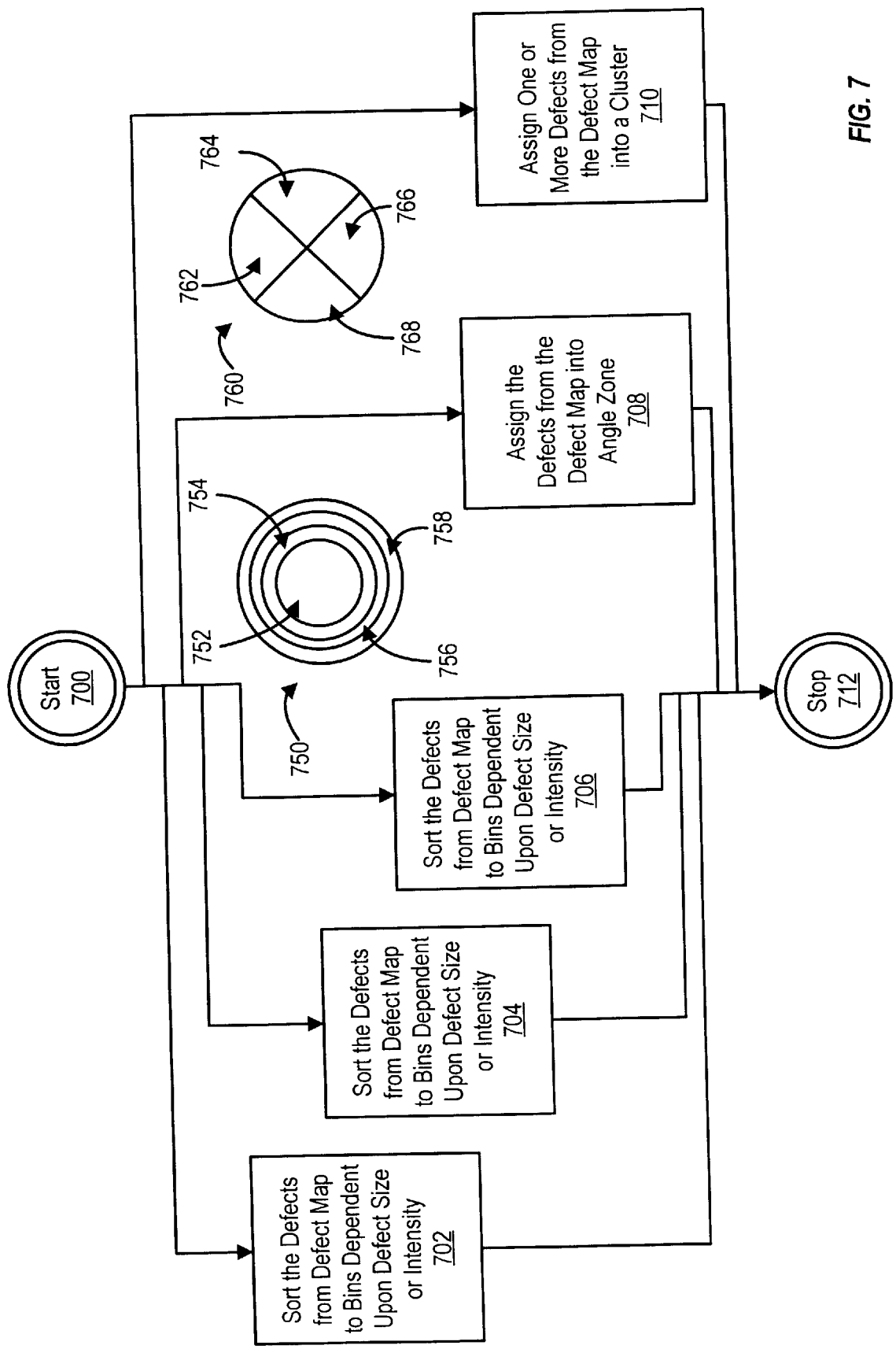
FIG. 7 shows a high-level logic flowchart and accompanying illustration of an example of the calculation of one or more defect groupings referenced in method step 604.

Referring now to FIG. 7 shown is a high-level logic flowchart and accompanying illustrations showing an example of the calculation of one or more defect groupings referenced in method step 604. The operations of FIG. 7 are shown drawn in parallel to illustrate the all or part of the illustrated operations can be performed within the spirit of the illustrated process.

Method step 700 shows the start of the process. Method step 702 depicts the operation of sorting the defects from defect map, utilizing associated defect location, defect size, and defect intensity table 305, into size bins, utilizing the size or intensity of the defects referenced in method step 602. Method step 704 illustrates the operation of assigning individual defects from defect map 304, utilizing associated defect location, defect size, and defect intensity table 305, into type/classification bins, utilizing the classification of defects data referenced in method step 602 (again, as noted in relation to method step 602, this information can be obtained by human review, auto defect classification on an off-line review tool, or in some cases, directly from the inspection tool); furthermore, not all defects will have a classification and in such instances those defects that do not have a classification are placed in an unclassified bin. Method step 706 illustrates the operation of assigning individual defects from defect map 304, utilizing associated defect location, defect size, and defect intensity table 305, into one or more radius zones (a radius zone describes the defects location with respect to its distance from the center of the wafer, and an illustration of radius zones 752, 754, 756 and 758 are shown on radius zone illustration wafer 750). Thereafter, method step 708 shows the operation of assigning individual defects from defect map 304, utilizing associated defect location, defect size, and defect intensity table 305, into one or more angle zones (an angle zone describes the defects location with the wafer divided into zone dependent on angles, and an illustration of angle zones in the form of quadrants 762, 764, 766 and 768 are shown on angle zone illustration wafer 760.) Method step 710 depicts the operation of assigning defects from defect map 304, utilizing associated defect location, defect size, and defect intensity table 305, into a cluster; in one embodiment of the process if a defect is within an assigned minimal distance (the distance being a design choice, with the purview of the system designer) of another defect it is defined as being in a cluster, but if no other defect is within the minimal distance from a defect under consideration, the defect under consideration is defined as being random. Method step 712 shows the end of the process.

Figure 8:
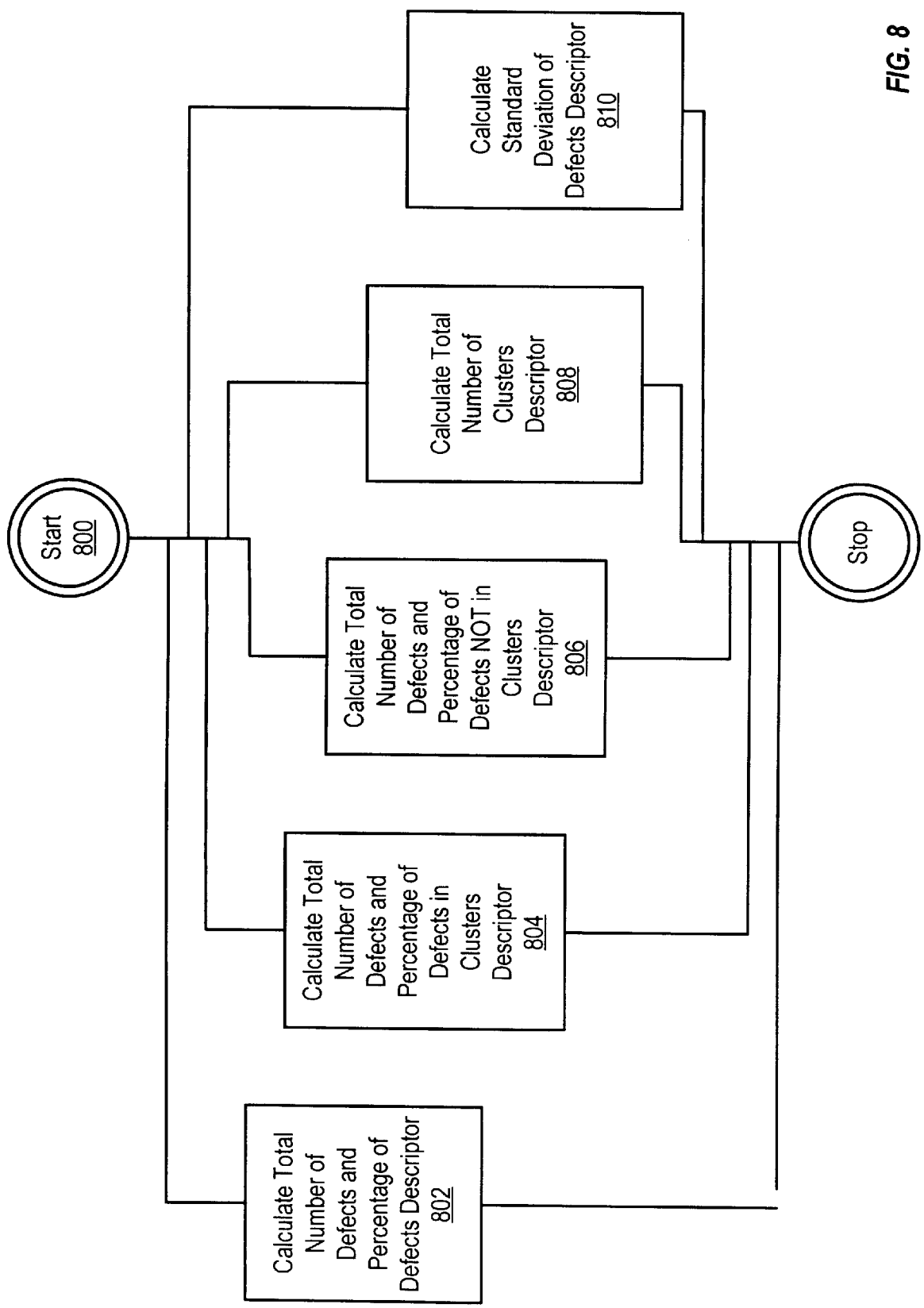
FIG. 8 shows a high-level logic flowchart and accompanying illustrations of examples of the calculation of one or more mathematical descriptors which quantitativize a wafer or defect signature utilizing the one or more defect grouping calculations of described in relation to FIG. 7

Referring now to FIG. 8 shown is a high-level logic flowchart and accompanying illustrations showing examples of the calculation of one or more mathematical descriptors to quantitativize the wafer or defect signature utilizing the one or more defect grouping calculations of described in relation to FIG. 7. Method step 800 shows the start of the process. Method step 802 shows the operation of calculating at least one "total number of defects and percentage of defects descriptor." This type of descriptor gives an absolute count and a relative number which quantitatively relate to the distribution of the defects over the wafer. Method step 804 shows the operation of calculating at least one "total number of defects and percentage of defects in clusters descriptor." This type of descriptor examines one or more of the clusters described in relation to FIG. 7 and gives an absolute count and a relative number which quantitatively relate to the distribution of the defects over the wafer. Method step 806 shows the operation of calculating at least one "total number of defects and percentage of defects not in clusters descriptor." This type of descriptor examines one or more of the clusters described in relation to FIG. 7 and gives an absolute count and a relative number which quantitatively relate to the distribution of the defects over the wafer. Method step 808 shows the operation of calculating at least one "total number of clusters descriptor." This type of descriptor examines one or more of the clusters described in relation to FIG. 7 and gives an absolute count of clusters which quantitatively relate to the distribution of the defects over the wafer. Method step 810 shows the operation of calculating at least one "standard deviation of defect descriptor." This type of descriptor, described in more detail below, examines one or more quantities related to the defects described in relation to FIG. 7 and gives an indication of the "spread" of the quantity examined.

Method step 802 referenced calculating one or more "total number of defects and percentage of defects descriptors." Illustrative examples of such descriptors are as follows:

(1) a total number of defects and/or percentage of defects in each size bin (e.g., a descriptor which gives the total count of defects in a particular size bin and/or an indication of what percentage that total count of defects in the particular size bin consititutes of the total number of defects in all size bins);

(2) a total number of defects and/or percentage of defects in each angle zone (e.g., a descriptor which gives the total count of defects in a particular angle zone and/or an indication of what percentage that total count of defects in the particular angle zone consititutes of the total number of defects in all angle zones);

(3) a total number of defects and/or percentage of defects in each radius zone (e.g., a descriptor which gives the total count of defects in a particular radius zone and/or an indication of what percentaage that total count of defects in the particular radius zone consititutes of the total number of defects in all radius zones);

(4) a total number of defects and/or percentage of defects in each classification bin (e.g., a descriptor which gives the total count of defects in a particular classification bin and/or an indication of what percentaage that total count of defects in the particular classification bin consititutes of the total number of defects in all classification bins).

Those skilled in the art will recognize that the foregoing example descriptors are merely exemplary and not limiting.

Method step 804 referenced calculating one or more "total number of defects and percentage of defects in clusters descriptors." Illustrative examples of such descriptors are as follows:

(1) a total number of defects and/or percentage of defects in clusters within each size bin (e.g., a descriptor which gives the total count of defects in clusters within a particular size bin and/or an indication of what percentaage that total count of defects in clusters within the particular size bin consititutes of the total number of defects in clusters within all size bins);

(2) a total number of defects and/or percentage of defects in clusters within each angle zone (e.g., a descriptor which gives the total count of defects in clusters within a particular angle zone and/or an indication of what percentaage that total count of defects in clusters within the particular angle zone consititutes of the total number of defects in clusters within all angle zones);

(3) a total number of defects and/or percentage of defects in clusters within clusters within each radius zone (e.g., a descriptor which gives the total count of defects in clusters within a particular radius zone and/or an indication of what percentaage that total count of defects in clusters within the particular radius zone consititutes of the total number of defects in clusters within all radius zones);

(4) a total number of defects and/or percentage of defects in clusters within each classification bin (e.g., a descriptor which gives the total count of defects in clusters within a particular classification bin and/or an indication of what percentage that total count of defects in clusters within the particular classification bin consititutes of the total number of defects in clusters within all classification bins).

Those skilled in the art will recognize that the foregoing example descriptors are merely exemplary and not limiting.

Method step 806 referenced calculating one or more "total number of defects and percentage of defects not in clusters (random) descriptors." Illustrative examples of such descriptors are as follows:

(1) a total number of defects and/or percentage of defects not in clusters (random) within each size bin (e.g., a descriptor which gives the total count of defects not in clusters (random) within a particular size bin and/or an indication of what percentaage that total count of defects not in clusters (random) within the particular size bin consititutes of the total number of defects not in clusters (random) within all size bins);

(2) a total number of defects and/or percentage of defects not in clusters (random) within each angle zone (e.g., a descriptor which gives the total count of defects not in clusters (random) within a particular angle zone and/or an indication of what percentaage that total count of defects not in clusters (random) within the particular angle zone consititutes of the total number of defects not in clusters (random) within all angle zones);

(3) a total number of defects and/or percentage of defects not in clusters (random) within clusters within each radius zone (e.g., a descriptor which gives the total count of defects not in clusters (random) within a particular radius zone and/or an indication of what percentaage that total count of defects not in clusters (random) within the particular radius zone consititutes of the total number of defects not in clusters (random) within all radius zones).

Those skilled in the art will recognize that the foregoing example descriptors e merely exemplary and not limiting.

Method step 808 referenced calculating one or more "total number of clusters descriptors." Illustrative examples of such descriptors are as follows:

(1) a total number of defects and/or percentage of defects not in clusters (random) within each angle zone (e.g., a descriptor which gives the total count of defects not in clusters (random) within a particular angle zone and/or an indication of what percentaage that total count of defects not in clusters (random) within the particular angle zone consititutes of the total number of defects not in clusters (random) within all angle zones);

(2) a total number of defects and/or percentage of defects not in clusters (random) within clusters within each radius zone (e.g., a descriptor which gives the total count of defects not in clusters (random) within a particular radius zone and/or an indication of what percentaage that total count of defects not in clusters (random) within the particular radius zone consititutes of the total number of defects not in clusters (random) within all radius zones).

Those skilled in the art will recognize that the foregoing example descriptors are merely exemplary and not limiting.

Method step 810 referenced calculating at least one or more"standard deviation of defect descriptor." Illustrative examples of such descriptors are as follows:

(1) the standard deviation of defects contained within each size bin;

(2) the standard deviation of defects contained within each angle zone;

(3) the standard deviation of defects contained within each radius zone.

Those skilled in the art will recognize that the foregoing example descriptors are merely exemplary and not limiting.

The foregoing has set forth processes by which mathematical descriptors, descriptive of defect signatures, can be calculated. Subsequent to the production of either all or a subset of the foregoing described descriptors, the descriptors can be used to train any of a number of commercially available knowledge based systems[5] to train such systems to associate the mathematical descriptors with the desired posited locations and causes of the defect signature. For example, the mathematical descriptors associated with the defect signatures of the defect maps shown in FIG. 4 would be utilized to train the knowledge based system such that the knowledge based system would function reach the same conclusions as that illustrated for human dispositioner 306 when viewing the defect signatures of the defect maps illustrated in FIG. 4.

[5] One such knowledge-based system is the KBWizard system produced by ISOA of Dallas,Tex.

In one version of the processes and devices utilized to replace a human dispositioner with an automated system, the knowledge base is a database or library consisting of known examples of a defective product. The examples are characterized by a group of mathematical descriptors, such as all or a subset of the descriptors discussed in relation to FIG. 8, each describing a particular aspect of the example, such as it's size or shape. Since the examples are essentially defined by the descriptors, it follows that a greater number of descriptors will lead to a better definition of the example. For each example, these descriptors assign a number to the characteristic they are describing, leading to the example being defined by a mathematical vector. For example, a knowledge base with 30 different descriptors will define each example as a mathematical vector in a 30 dimensional space.

Using this vector representation, an unknown sample can be characterized by these descriptors and then have it's vector description compared to the known examples in the knowledge base in order to determine the closest match. This will identify the unknown sample within arrange of certainty, depending upon the closeness of the match. This certainty level can be adjusted by the user to determine whether or not the classification is acceptable. Unacceptable or unknown classifications can later be identified manually and, if desired, be added to the knowledge base as known examples.

The foregoing described how processes and devices used herein can be used with a knowledge based system generally. Those skilled in the art will recognize that the foregoing is merely exemplary and that many other types of knowledge based systems can be likewise trained.

The foregoing detailed description set forth various embodiments of the present invention via the use of block diagrams, flowcharts, and examples. It will be understood as notorious by those within the art that each block diagram component, flowchart step, and operations and/or components illustrated by the use of examples can be implemented, individually and/or collectively, by a wide range of hardware, software, firmware, or any combination thereof. In one embodiment, the present invention is implemented via software running on a computer. However, those skilled in the art will recognize that the embodiments disclosed herein, in whole or in part, can be equivalently implemented in Application Specific Integrated Circuits (ASICs), standard Integrated Circuits, as a computer program running on a computer, as firmware, or as virtually any combination thereof and that designing the circuitry and/or writing the code for the software or firmware would be well within the skill of one of ordinary skill in the art in light of this disclosure.

The foregoing described embodiments depict different components contained within, or connected with, different other components. It is to be understood that such depicted architectures are merely exemplary, and that in fact many other architectures can be implemented which achieve the same functionality. In an abstract, but still definite, sense those within the art will appreciate that any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use of definite articles.

What is claimed is:

1. A method comprising:

quantitativizing a qualitative integrated circuit wafer defect signature, said quantitativizing a qualitative integrated circuit wafer defect signature including making a qualitative integrated circuit wafer defect signature quantitative, said quantitavizing a qualitative integrated circuit wafer defect signature including accepting at least one quantitative description of a defect in a defect signature;

calculating a defect grouping utilizing the at least one quantitative description of the defect in the defect signature; and calculating a mathematical descriptor of the defect grouping utilizing the defect grouping; and in response to said quantitativizing, identifying at least one cause of the defect signature using the mathematical descriptor.

2. The method of claim 1, wherein said accepting at least one quantitative description of a defect in a defect signature further comprises:

accepting a location of the defect.

3. The method of claim 1, wherein said accepting at least one quantitative description of a defect in a defect signature further comprises:

accepting a size of the defect.

4. The method of claim 1, wherein said accepting at least one quantitative description of a defect in a defect signature further comprises:

accepting an intensity of the defect.

5. The method of claim 1, wherein said accepting at least one quantitative description of a defect in a defect signature further comprises:
   accepting a classification of the defect.

6. The method of claim 1, wherein said calculating a defect grouping utilizing the at least one quantitative description of the defect in the defect signature further comprises:
   calculating a defect grouping utilizing at least one location of the defect in the defect signature.

7. The method of claim 1, wherein said calculating a defect grouping utilizing the at least one quantitative description of the defect in the defect signature further comprises:
   calculating a defect grouping utilizing at least one size of the defect in the defect signature.

8. The method of claim 1, wherein said calculating a defect grouping utilizing the at least one quantitative description of the defect in the defect signature further comprises:
   calculating a defect grouping utilizing at least one intensity of the defect in the defect signature.

9. The method of claim 1, wherein said calculating a defect grouping utilizing the at least one quantitative description of the defect in the defect signature further comprises:
   calculating at least one defect grouping utilizing at least one classification of the defect in the defect signature.

10. The method of claim 1, wherein said calculating at least one defect grouping utilizing the at least one quantitative description of the defect in the defect signature further comprises.
    sorting at least one defect into a bin dependent upon a defect size.

11. The method of claim 1, wherein said calculating at least one defect grouping utilizing the at least one quantitative description of the defect in the defect signature further comprises:
    sorting at least one defect into a bin dependent upon defect intensity.

12. The method of claim 1, wherein said calculating at least one defect grouping utilizing the at least one quantitative description of the defect in the defect signature further comprises:
    assigning at least one defect into a bin dependent upon a defect classification.

13. The method of claim 1, wherein said calculating at least one defect grouping utilizing the at least one quantitative description of the defect in the defect signature further comprises:
    assigning at least one defect into a radius zone.

14. The method of claim 1, wherein said calculating at least one defect grouping utilizing the at least one quantitative description of the defect in the defect signature further comprises:
    assigning at least one defect into an angle zone.

15. The method of claim 1, wherein said calculating at least one defect grouping utilizing the at least one quantitative description of the defect in the defect signature further comprises:
    assigning at least one defect into a cluster.

16. The method of claim 1, wherein said quantitativizing a qualitative integrated circuit wafer defect signature further comprises:
    calculating a descriptor having a count of a total number of defects related to the at least one defect grouping.

17. The method of claim 1, wherein said quantitativizing a qualitative integrated circuit wafer defect signature further comprises:
    calculating a descriptor having a count of a total number of defects in clusters related to the at least one defect grouping.

18. The method of claim 1, wherein said quantitativizing a qualitative integrated circuit wafer defect signature further comprises:
    calculating a descriptor having a count of a total number of defects not in clusters related to the at least one defect grouping.

19. The method of claim 1, wherein said quantitativizing a qualitative integrated circuit wafer defect signature further comprises:
    calculating a descriptor having a standard deviation related to the at least one defect grouping.

20. The method of claim 1 wherein said identifying at least one cause of the defect signature further comprises:
    comparing a quantitativized defect signature against at least one quantitativized known defect signature.

21. The method of claim 20, further comprising:
    in response to said comparing, positing a location within a production process at which the cause of the quantitativized defect signature resides.

22. The method of claim 20, further comprising:
    in response to said comparing, positing an event or condition within a production process which gave rise to the quantitativized defect signature.

23. The method of claim 20, wherein said comparing a quantitativized defect signature against at least one quantitativized known defect signature further comprises:
    performing said comparing via use of a knowledge based system.

24. A system comprising:
    means for quantitativizing a qualitative integrated circuit wafer defect signature signature, said means for quantitativizing a qualitative integrated circuit wafer defect signature including means for making a qualitative integrated circuit wafer defect signature quantitative said means for quantitavizing a qualitative integrated circuit wafer defect signature including
      means for accepting at least one quantitative description of a defect in a defect signature;
      means for calculating a defect grouping utilizing the at least one quantitative description of the defect in the defect signature; and,
      means for calculating a mathematical descriptor of the defect grouping utilizing the defect grouping; and
    means, responsive to said means for quantitativizing, for identifying at least one cause of the defect signature using the mathematical descriptor.

25. The system of claim 24, wherein said means for accepting at least one quantitative description of a defect in a defect signature further comprises:
    means for accepting a location of the defect.

26. The system of claim 24, wherein said means for accepting at least one quantitative description of a defect in a defect signature further comprises:
    means for accepting a size of the defect.

27. The system of claim 24, wherein said means for accepting at least one quantitative description of a defect in a defect signature further comprises:
    means for accepting an intensity of the defect.

28. The system of claim 24, wherein said means for accepting at least one quantitative description of a defect in a defect signature further comprises:
   means for accepting a classification of the defect.

29. The system of claim 24, wherein said means for calculating a defect grouping utilizing the at least one quantitative description of the defect in the defect signature further comprises:
   means for calculating a defect grouping utilizing at least one location of the defect in the defect signature.

30. The system of claim 24, wherein said means for calculating a defect grouping utilizing the at least one quantitative description of the defect in the defect signature further comprises:
   means for calculating a defect grouping utilizing at least one size of the defect in the defect signature.

31. The system of claim 24, wherein said means for calculating a defect grouping utilizing the at least one quantitative description of the defect in the defect signature further comprises:
   means for calculating a defect grouping utilizing at least one intensity of the defect in the defect signature.

32. The system of claim 24, wherein said means for calculating a defect grouping utilizing the at least one quantitative description of the defect in the defect signature further comprises:
   means for calculating at least one defect grouping utilizing at least one classification of the defect in the defect signature.

33. The system of claim 24, wherein said means for calculating at least one defect grouping utilizing the at least one quantitative description of the defect in the defect signature further comprises:
   means for sorting at least one defect into a bin dependent upon a defect size.

34. The system of claim 24, wherein said means for calculating at least one defect grouping utilizing the at least one quantitative description of the defect in the defect signature further comprises:
   means for sorting at least one defect into a bin dependent upon defect intensity.

35. The system of claim 24, wherein said means for calculating at least one defect grouping utilizing the at least one quantitative description of the defect in the defect signature further comprises:
   means for assigning at least one defect into a bin dependent upon a defect classification.

36. The system of claim 24, wherein said means for calculating at least one defect grouping utilizing the at least one quantitative description of the defect in the defect signature further comprises:
   means for assigning at least one defect into a radius zone.

37. The system of claim 24, wherein said means for calculating at least one defect grouping utilizing the at least one quantitative description of the defect in the defect signature further comprises:
   means for assigning at least one defect into an angle zone.

38. The system of claim 24, wherein said means for calculating at least one defect grouping utilizing the at least one quantitative description of the defect in the defect signature further comprises:
   means for assigning at least one defect into a cluster.

39. The system of claim 24, wherein said means for quantitativizing a qualitative integrated circuit wafer defect signature further comprises:
   means for calculating a descriptor having a count of a total number of defects related to the at least one defect grouping.

40. The system of claim 24, wherein said means for quantitativizing a qualitative integrated circuit wafer defect signature further comprises:
   means for calculating a descriptor having a count of a total number of defects in clusters related to the at least one defect grouping.

41. The system of claim 24, wherein said means for quantitativizing a qualitative integrated circuit wafer defect signature further comprises:
   means for calculating a descriptor having a count of a total number of defects not in clusters related to the at least one defect grouping.

42. The system of claim 24, wherein said means for quantitativizing a qualitative integrated circuit wafer defect signature further comprises:
   means for calculating a descriptor having a standard deviation related to the at least one defect grouping.

43. The system of claim 24, wherein said means for identify at least one cause of the defect signature further comprises:
   means for comparing a quantitativized defect signature against at least one quantitativized known defect signature.

44. The system of claim 43, further comprising:
   means, responsive to said means for comparing, for positing a location within a production process at which the cause of the quantitativized defect signature resides.

45. The system of claim 43, further comprising:
   means, responsive to said means for comparing, for positing an event or condition within a production process which gave rise to the quantitativized defect signature.

46. The system of claim 43, wherein said means for comparing a quaititativized defect signature against at least one quantitativized known defect signature further comprises:
   means for performing said means for comparing via use of a knowledge based system.

* * * * *